(12) United States Patent
Thronson et al.

(10) Patent No.: US 7,559,557 B2
(45) Date of Patent: Jul. 14, 2009

(54) SEALING BETWEEN VACUUM CHAMBERS

(75) Inventors: Gregory D. Thronson, Groveland, MA (US); Jeffrey A. Burgess, Manchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 180 days.

(21) Appl. No.: 11/894,979

(22) Filed: Aug. 22, 2007

(65) Prior Publication Data

US 2009/0050825 A1    Feb. 26, 2009

(51) Int. Cl.
  *G21K 5/00*  (2006.01)
  *H01J 37/18* (2006.01)
  *G03B 27/52* (2006.01)
  *F16J 15/00* (2006.01)

(52) U.S. Cl. .................. 277/628; 277/626; 277/627; 277/590; 277/913; 250/492.21; 250/492.3

(58) Field of Classification Search ............ 250/492.21, 250/492.3, 522.1; 277/312–315, 590, 591, 277/602, 625–628, 910, 913
See application file for complete search history.

(56) References Cited

U.S. PATENT DOCUMENTS

| | | | | |
|---|---|---|---|---|
| 5,672,882 A | * | 9/1997 | Day et al. | 250/492.21 |
| 6,296,255 B1 | * | 10/2001 | Hashimoto | 277/558 |
| 6,580,082 B1 | * | 6/2003 | Mitchell | 250/492.2 |
| 6,583,428 B1 | * | 6/2003 | Chipman et al. | 250/492.21 |
| 6,688,604 B2 | * | 2/2004 | Hashimoto | 277/558 |
| 6,734,947 B2 | * | 5/2004 | Watson et al. | 355/30 |
| 7,246,800 B2 | * | 7/2007 | Hashimoto | 277/558 |
| 7,464,941 B2 | * | 12/2008 | Hashimoto | 277/558 |
| 2003/0047881 A1 | * | 3/2003 | Worm et al. | 277/628 |
| 2005/0156387 A1 | * | 7/2005 | Chen et al. | 277/628 |
| 2009/0050825 A1 | * | 2/2009 | Thronson et al. | 250/492.21 |

* cited by examiner

*Primary Examiner*—Bernard E Souw

(57) ABSTRACT

A sealing system is disclosed. One such sealing system includes a first vacuum chamber and a second vacuum chamber. The sealing system includes a first sealing unit having a proximal end and a distal end, the proximal end of the first sealing unit disposed on the first vacuum chamber. The sealing system includes a second sealing unit having a distal end and a proximal end, the distal end of the second sealing unit disposed on the distal end of the first sealing unit and the proximal end of the second sealing unit disposed on the second vacuum chamber. One of the sealing units is concave, while the other is convex. The sealing system also includes a first o-ring, a second o-ring, and a third o-ring.

22 Claims, 7 Drawing Sheets

SEALING BETWEEN VACUUM CHAMBERS

FIELD

This invention relates to seals and, more particularly, to seals between two vacuum chambers.

BACKGROUND

Ion implantation is a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material.

An ion implanter includes an ion source for converting a gas or a solid material into a well-defined ion beam. The ion beam typically is mass analyzed to eliminate undesired ion species, accelerated to a desired energy, and implanted into a target. The ion beam may be distributed over the target area by electrostatic or magnetic beam scanning, by target movement, or by a combination of beam scanning and target movement. The ion beam may be a spot beam or a ribbon beam having a long dimension and a short dimension.

Many components of an ion implanter are operated under vacuum in a vacuum chamber. Besides allowing ion implantation to occur, a vacuum may be desirable during ion implantation to reduce contaminant particles that could transfer to a workpiece. Uncontrolled leaks in these vacuum chambers used for ion implantation can cause an ion beam to scatter and allow particles to enter the vacuum chamber.

If two vacuum chambers need to be linked, seals are required to keep both chambers at vacuum. A previous method for forming such a seal is, for example, using a wedge-shaped seal design with a face seal on both sides of the wedge. This method may provide compliance for linear misalignments, but provides very little compliance for angular misalignments. Another example is the use of flexible bellows, but this is typically difficult to install and is cost-prohibitive for larger openings. Yet another example is the use of a piston seal on one end of the seal and a face seal on the other end. However, this particular method provides very little angular compliance due to o-ring compression and usually requires alignment.

Accordingly, there is a need in the art for a new and improved apparatus to seal between vacuum chambers.

SUMMARY

According to a first aspect of the invention, a sealing system is provided. The sealing system may comprise a first vacuum chamber having walls defining a first vacuum chamber aperture, and a second vacuum chamber having walls defining a second vacuum chamber aperture. The sealing system also may comprise a first sealing unit having a body defining an opening, the first sealing unit having a proximal end and a distal end, the proximal end of the first sealing unit disposed on the first vacuum chamber; and a second sealing unit having a body defining an opening, the second sealing unit having a distal end and a proximal end, the distal end of the second sealing unit disposed on the distal end of the first sealing unit, the proximal end of the second sealing unit disposed on the second vacuum chamber. The sealing system may also comprise a first o-ring disposed between the first sealing unit and the first vacuum chamber; a second o-ring disposed between the second sealing unit and the second vacuum chamber; and a third o-ring disposed between the second sealing unit and the first sealing unit.

According to a second aspect of the invention, an ion implanter is provided. The ion implanter may comprise an ion generator; a first vacuum chamber having walls defining a first vacuum chamber aperture; and a second vacuum chamber having walls defining a second vacuum chamber aperture. The ion implanter may also comprise a first sealing unit having a body defining an opening, the first sealing unit having a proximal end and a distal end, the proximal end of the first sealing unit disposed on the first vacuum chamber; and a second sealing unit having a body defining an opening, the second sealing unit having a distal end and a proximal end, the distal end of the second sealing unit disposed on the distal end of the first sealing unit, the proximal end of the second sealing unit disposed on the second vacuum chamber. The ion implanter may also comprise a first o-ring disposed between the first sealing unit and the first vacuum chamber; a second o-ring disposed between the second sealing unit and the second vacuum chamber; and a third o-ring disposed between the second sealing unit and the first sealing unit.

BRIEF DESCRIPTION OF THE DRAWINGS

For a better understanding of the present disclosure, reference is made to the accompanying drawings, in which like elements are referenced with link numerals and in which.

DETAILED DESCRIPTION

The sealing system is described herein in connection with an ion implanter. However, the sealing system can be used with other systems and processes involved in semiconductor manufacturing or other systems that use vacuum chambers. Thus, the invention is not limited to the specific embodiments described below.

Figure 1:
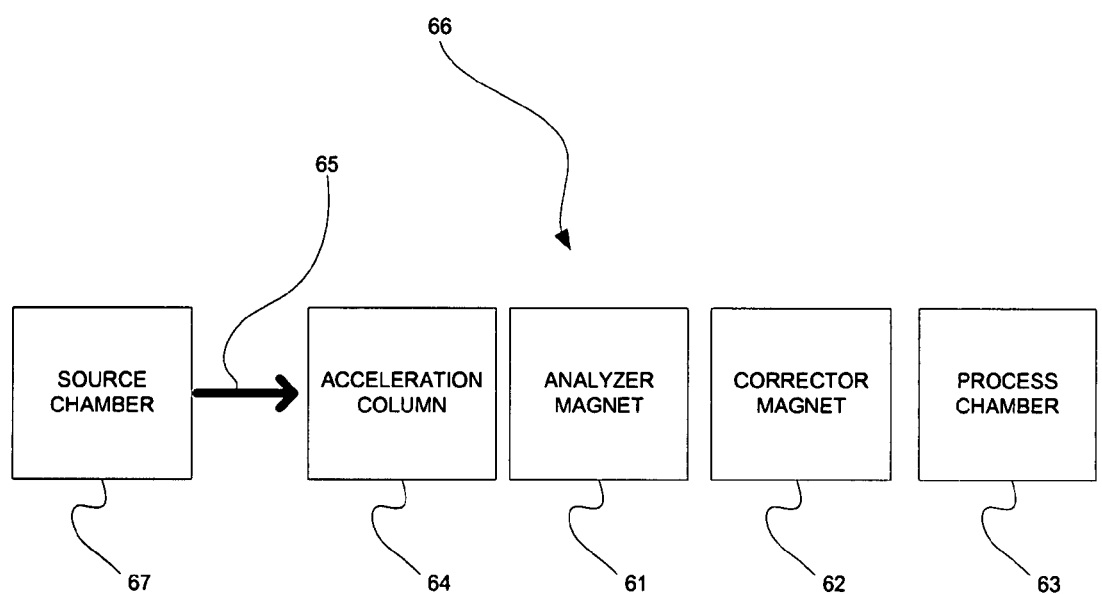
FIG. 1 is a block diagram of an embodiment of an ion implanter.

FIG. 1 is view of an embodiment of an ion implanter. Ion implanters are devices known to those skilled in the art to generate an ion beam 65 and implant ions from the ion beam 65 into a workpiece. Embodiments of this sealing system may be used in, for example, ion implanter 66. Two such places are, for example, between an analyzer magnet 61 and a corrector magnet 62 or between a corrector magnet 62 and a process chamber 63. In some embodiments of ion implanter 66, this sealing system may be used between an acceleration column 64 and an analyzer magnet 61. In other embodiments of an ion implanter, this sealing system may be used between a source chamber 67 and an analyzer magnet 61. Embodiments of this sealing device may also be used elsewhere in an ion implanter known to those skilled in the art.

However, this sealing system is not limited solely to applications with an ion implanter. This sealing system is configured for sealing between two modules. This may be in other forms of semiconductor manufacturing equipment, or other industrial or scientific equipment.

Figure 2:
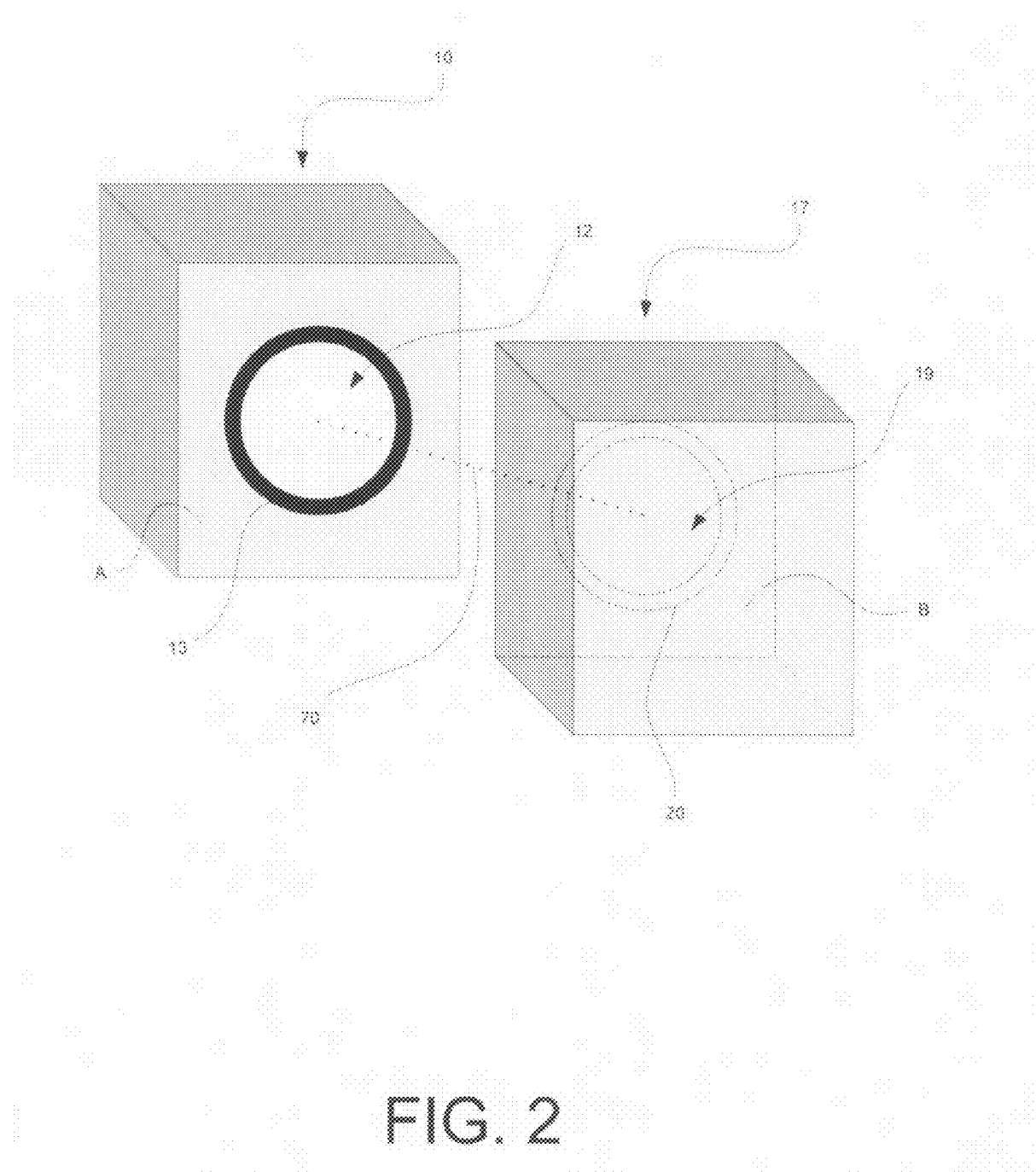
FIG. 2 is a perspective view of an embodiment of two vacuum chambers.

FIG. 2 is a perspective view of an embodiment of two vacuum chambers. First vacuum chamber 10 and second vacuum chamber 17 are positioned such that a sealing device may form a vacuum seal between the two chambers. First vacuum chamber 10 and second vacuum chamber 17 may be aligned along line 70. First vacuum chamber 10 defines first vacuum chamber aperture 12 on surface A and second vacuum chamber 17 defines second vacuum chamber aperture 19 on surface B. Surface A and surface B are opposite one another in this embodiment. In this particular embodiment, first vacuum chamber aperture 12 and second vacuum chamber aperture 19 are round, however both may be other shapes known to those skilled in the art.

First sealing unit 13 is disposed in or about first vacuum chamber aperture 12. Second sealing unit 20 is disposed in or about second vacuum chamber aperture 19. First sealing unit 13 and second sealing unit 20 will mate or couple and form a seal between first vacuum chamber 10 and second vacuum chamber 17 as described herein.

Figure 3:
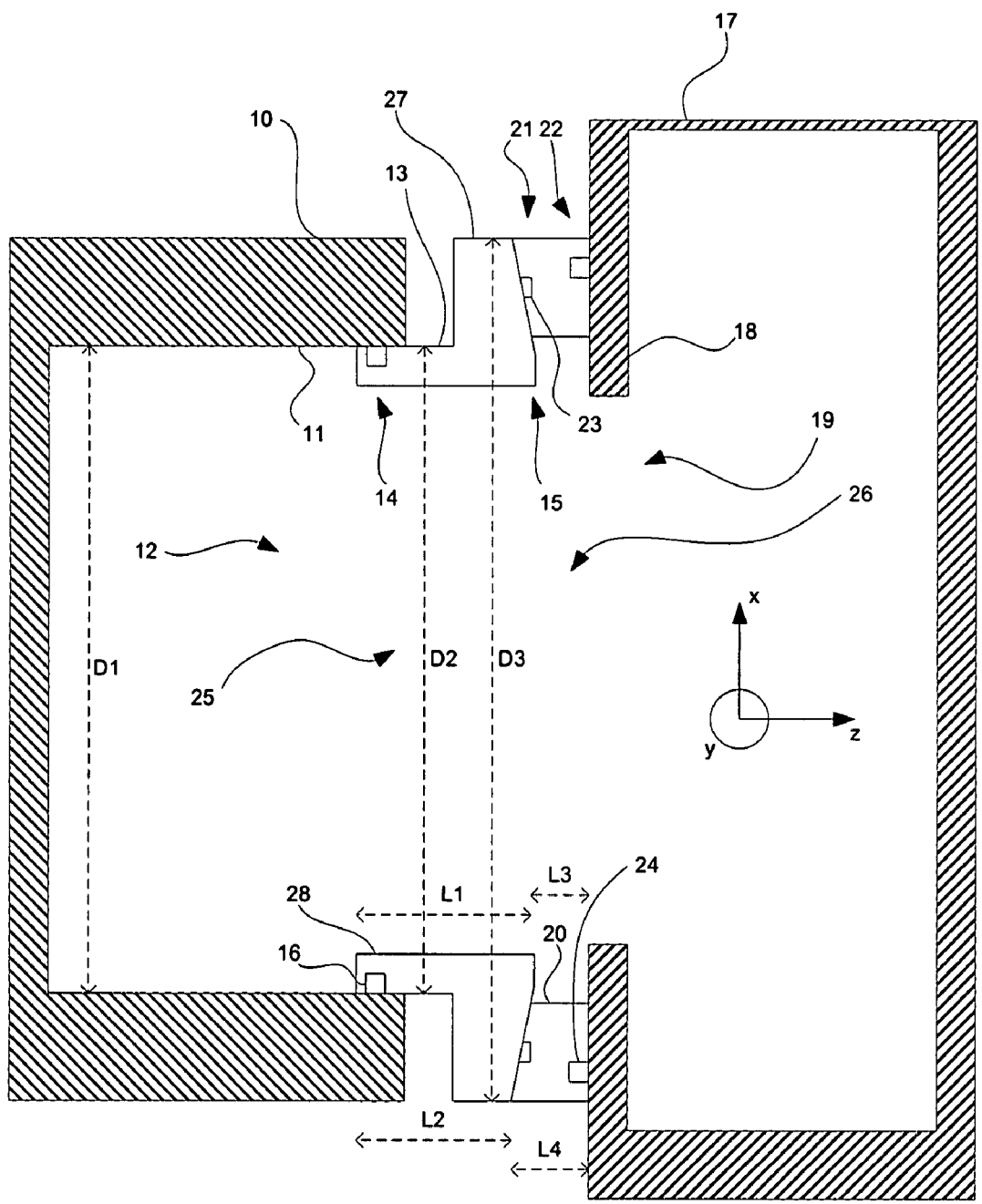
FIG. 3 is a cross-sectional view of an embodiment of an apparatus for sealing between vacuum chambers.

FIG. 3 is a cross-sectional view of an embodiment of an apparatus for sealing between vacuum chambers. The sealing system is located between two vacuum chambers: first vacuum chamber 10 and second vacuum chamber 17. First vacuum chamber 10 and second vacuum chamber 17 are located respective to the axes illustrated in FIG. 3.

First vacuum chamber 10 has walls 11 that define first vacuum chamber aperture 12 having aperture diameter D1. Second vacuum chamber 17 has walls 18 that define second vacuum chamber aperture 19. First vacuum chamber aperture 12 and second vacuum chamber aperture 19 may be round or other shapes known to those skilled in the art. Thus, first sealing unit 13 and second sealing unit 20 may be round or other shapes in order to form a seal between first vacuum chamber 10 and second vacuum chamber 17.

First sealing unit 13 is a hollow body having a proximal end 14, distal end 15, and walls that form first sealing unit opening 25, which may be round or other shapes. First sealing unit 13 in this embodiment is round, but may be other shapes known to those skilled in the art. Proximal end 14 is configured to be slidably received by first vacuum chamber aperture 12 in this embodiment. Distal end 15 is configured to have a substantially convex shape in this embodiment. This means that the length between proximal end 14 and distal end 15 of first sealing unit 13 is substantially longer toward the center of a cross-section of first sealing unit 13 (L1) than at the periphery of a cross-section of first sealing unit 13 (L2). This substantially convex shape may be curved or may involve angled flat surfaces, as seen in FIG. 3.

In this embodiment, first sealing unit 13 has two outer diameters: D2 and D3. D3 corresponds with shelf 27. Outer diameter D3 is substantially larger than outer diameter D2 in this embodiment. Outer diameter D2 is slightly less wide than aperture diameter D1. Thus, first sealing unit 13 may be slidably received within first vacuum chamber aperture 12, and the length of first sealing unit 13 within first vacuum chamber aperture 12 may be slidably adjusted. Outer diameter D3 of shelf 27 is substantially larger than aperture diameter D1. Therefore, movement by first sealing unit 13 is halted when shelf 27 contacts walls 11. First sealing unit 13 may be prevented from falling into first vacuum chamber 10 in this manner. Thus, first sealing unit 13 is disposed on wall 11 of first vacuum chamber 10 and moves in the z direction illustrated by the axes of FIG. 3.

In another embodiment, first sealing unit 13 may have a single outer diameter, such as, for example, a first sealing unit 13 with only an outer diameter D2 and no shelf 27. Thus, the diameter of first sealing unit 13 would be uniform and first sealing unit 13 would be moveable to a position flush with first vacuum chamber 10. In a further embodiment, first sealing unit 13 may telescope outward from first vacuum chamber 10 with multiple segments.

First sealing unit 13 has first o-ring 16 on the outer surface of first sealing unit 13. In this embodiment, first o-ring 16 runs the entire circumference of first sealing unit 13, but may vary in dimensions and shape as known to those skilled in the art. In this embodiment, first o-ring 16 is located near proximal end 14. However, first o-ring 16 may also be located in other places. In this particular embodiment, first o-ring 16 is a piston-type seal forming a loop around first sealing unit 13. First o-ring 16 is disposed between the first sealing unit 13 and walls 11 of first vacuum chamber 10.

First o-ring 16, in this embodiment, is recessed within first sealing unit 13. This recess is located on body 28 of first sealing unit 13. Body 28 of first sealing unit 13 corresponds with D2. First o-ring 16 may be disposed on all or part of the length of body 28. First o-ring 16 is not limited to being recessed and may also be disposed on all or part of the body 28, similar to a gasket, or be disposed on shelf 27 using other designs known to those skilled in the art. First o-ring 16 contributes to maintaining first vacuum chamber 10 and second vacuum chamber 17 at vacuum when first sealing unit 13 and second sealing unit 20 are mated or coupled Second sealing unit 20 is a hollow body having a distal end 21, proximal end 22, and walls that form second sealing unit opening 26. Second sealing unit opening 26 may be larger in width than first sealing unit opening 25, but may also be smaller or equal in width. Second sealing unit 20 in this embodiment is round, but may be other shapes known to those skilled in the art. Proximal end 22 is configured be disposed on walls 18. Distal end 21 is configured to have a substantially concave shape that mates or couples with the substantially convex distal end 15 of first sealing unit 13 in this embodiment. This means that length between distal end 21 and proximal end 22 of second sealing unit 20 is substantially shorter toward the center of a cross-section of second sealing unit 20 (L3) than at the periphery of a cross-section of second sealing unit 20 (L4). Substantially concave distal end 21 is configured to mate or couple with substantially convex distal end 15 of first sealing unit 13. This substantially concave shape may be curved or may involve angled flat surfaces, as seen in FIG. 3. Provided a seal is formed that can hold first vacuum chamber 10 and second vacuum chamber 17 at vacuum, the face of first sealing unit 13 may be a different size than the face of second sealing unit 20.

First sealing unit 13 and second sealing unit 20 in this embodiment have circular faces. However, other shapes of proximal end 14, distal end 15, distal end 21, and proximal end 22 are possible if the shape provides a seal between first sealing unit 13 and second sealing unit 20, first sealing unit 13 and first vacuum chamber 10, and second sealing unit 20 and second vacuum chamber 17.

In this embodiment, first sealing unit 13 and second sealing unit 20 are composed of stainless steel, plated steel, or aluminum. However, any material capable of sustaining a vacuum may be used, such as, for example, metals, metal alloys, or composites. First sealing unit 13 and second sealing unit 20 are not limited solely to being composed of metallic materials. For example, first sealing unit 13 and second sealing unit 20 may be composed of plastics and epoxy resin in other embodiments.

In an alternate embodiment, first sealing unit 13 or second sealing unit 20 may further comprise flanges, guides, or lips to assist in mating or coupling between first sealing unit 13 and second sealing unit 20. These may be disposed on the outer diameter of either first sealing unit 13 or second sealing unit 20.

Third o-ring 23 and second o-ring 24 are disposed on second sealing unit 20. This may be on the outer surface of second sealing unit 20, as in this embodiment, or an internal surface of second sealing opening 26. Third o-ring 23 may be a spherical face seal (i.e., a seal between two nested spherical surfaces, such as, for example, one concave surface and one convex surface) disposed between the substantially concave distal end 21 of second sealing unit 20 and the substantially convex distal end 15 of first sealing unit 13. Third o-ring 23 runs the entire circumference of second sealing unit 20 in this embodiment and may vary in dimensions and shape as known to those skilled in the art. Third o-ring 23 contributes to maintaining first vacuum chamber 10 and second vacuum chamber 17 at vacuum when first sealing unit 13 and second sealing unit 20 are mated or coupled.

Second o-ring 24 is a face seal (i.e., a seal between two flat surfaces) disposed between second sealing unit 20 and walls 18 of second vacuum chamber 17. Second o-ring 24 runs the entire circumference of second sealing unit 20 in this embodiment and may vary in dimensions and shape as known to those skilled in the art. Second o-ring 24 contributes to maintaining first vacuum chamber 10 and second vacuum chamber 17 at vacuum when first sealing unit 13 and second sealing unit 20 are mated or coupled.

Second o-ring 24 and third o-ring 23, in this embodiment, are recessed within second sealing unit 20. Second o-ring 24 and third o-ring 23 are not limited to being recessed and may also be disposed on all or part of the outer surface of second sealing unit 20, similar to a gasket, or be disposed on second sealing unit 20 using other designs known to those skilled in the art. Third o-ring 23 may also be disposed, either recessed or on the outer surface, on first sealing unit 13 instead of second sealing unit 20 in another embodiment. In other embodiments, second o-ring 24 is disposed on second vacuum chamber 17. In another embodiment, second sealing unit 20 is disposed on second vacuum chamber 17 and the second o-ring 24 is not required, such as, for example, through welding the second sealing unit 20 to second vacuum chamber 17 or fabricating second sealing unit 20 as part of second vacuum chamber 17.

In an alternate embodiment, first sealing unit 13 may have a substantially concave configuration and second sealing unit 20 may have a substantially convex configuration. Thus, distal end 15 of first sealing unit 13 may be substantially concave and mate or couple with the substantially convex distal end 21 of second sealing unit 20.

In another embodiment, first sealing unit 13 and second sealing unit 20 have at least one extra seal disposed on them besides first o-ring 16, second o-ring 24, and third o-ring 23.

First o-ring 16, second o-ring 24, and third o-ring 23 may be composed of Buna or Viton® of DuPont Performance Elastomers. However, other compounds or compositions known to those skilled in the art may be used for first o-ring 16, second o-ring 24, and third o-ring 23, so these o-rings are not limited solely to being composed of Buna or Viton®. Any material that allows formation and maintenance of a vacuum between first vacuum chamber 10 and second vacuum chamber 17 may be used. First o-ring 16, second o-ring 24, and third o-ring 23 may also be other sealing devices known to those skilled in the art that will allow a seal to be formed between first vacuum chamber 10 and second vacuum chamber 17.

To use this sealing system, first sealing unit 13 is moved into first vacuum chamber aperture 12 along the z axes illustrated in FIG. 3. First sealing unit 13 may be moved deep enough that shelf 27 of first sealing unit 13 is against walls 11 of first vacuum chamber 10 or may be moved substantially less. Movement of first sealing unit 13 may be done, for example, by hand or by electromechanical actuator.

Figure 5:
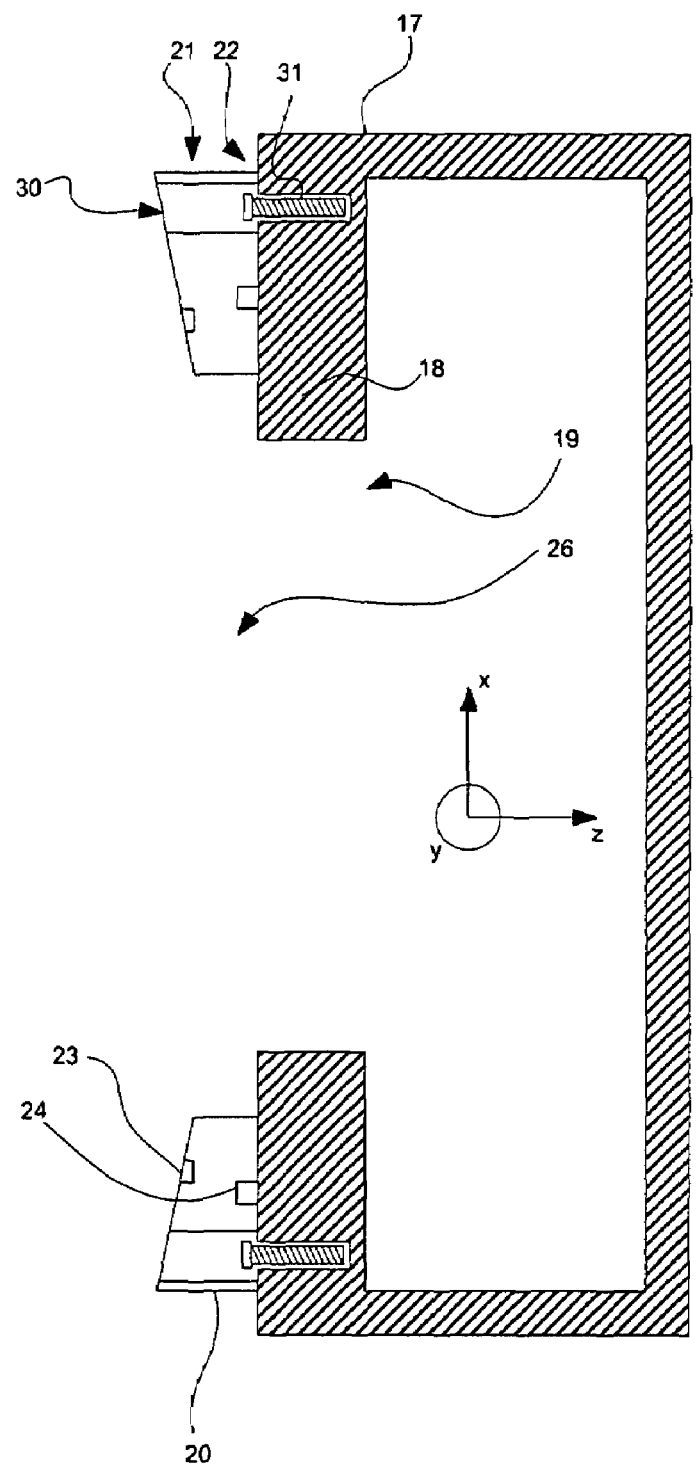
FIG. 5 is a cross-sectional view of an embodiment of a second sealing unit disposed on a second vacuum chamber.

Second sealing unit 20 is attached to walls 18 of second vacuum chamber 17. Second sealing unit 20 may only be attached loosely to second vacuum chamber 17 to allow for manipulation of second sealing unit 20 during mating or coupling, but may also be attached so that movement of second sealing unit 20 is not possible. This may be using, for example, as least one fastener as seen in FIG. 5, an apparatus or member configured to dispose second sealing unit 20 against second vacuum chamber 17, or other means or apparatus known to those skilled in the art.

Both first vacuum chamber 10 and second vacuum chamber 17 are placed into their desired position for sealing, if they are not already, within an ion implanter, other apparatus, or just as two stand-alone vacuum chambers. First sealing unit 13 is moved from first vacuum chamber aperture 12 along the z axes indicated in FIG. 3. Second sealing unit 20 may also be moved or adjusted along the x and y directions if required, as indicated by the axes in FIG. 3, to align second sealing unit 20 with first sealing unit 13. Second sealing unit 20 may then be fastened securely to walls 18 of second vacuum chamber 17 using, for example, at least one fastener 31 as seen in FIG. 5.

In some cases, it may be necessary to further move first sealing unit 13 along the z direction to mate or couple with second sealing unit 20 by bringing first sealing unit 13 in contact or near-contact with second sealing unit 20 to allow for the adjustment of second sealing unit 20. However, in other cases, first sealing unit 13 and second sealing unit 20 are already in contact when second sealing unit 20 is moved or adjusted along the x and y direction. In some other cases, second sealing unit 20 does not require adjustment.

Third o-ring 23 is then compressed while first sealing unit 13 and second sealing unit 20 mate or couple. Third o-ring 23 will compensate for any angular misalignment in the x, y, or z direction. First sealing unit 13 and second sealing unit 20 are then fastened as described below. In another embodiment, first sealing unit 13 and second sealing unit 20 are not fastened and are held together solely by vacuum.

First o-ring 16, second o-ring 24, and third o-ring 23 provide compliance in all three directions of the axes illustrated in FIG. 3. First o-ring 16 provides compliance for misalignments in the δz direction. Second o-ring 24 provides compliance for misalignments in the δx and δy directions. Third o-ring 23 likewise provides compliance for misalignments in the δx and δy directions. Second o-ring 24 and third o-ring 23 provide some compliance in the δz direction due to compression of the seals. Besides this compliance, the combination of the three seals and the substantially concave and substantially convex sealing units provide six degrees of freedom. These six degrees of freedom include moving in the δx, δy, and δz directions, but also tilting or turning in the δx, δy, and δz directions.

Figure 4:
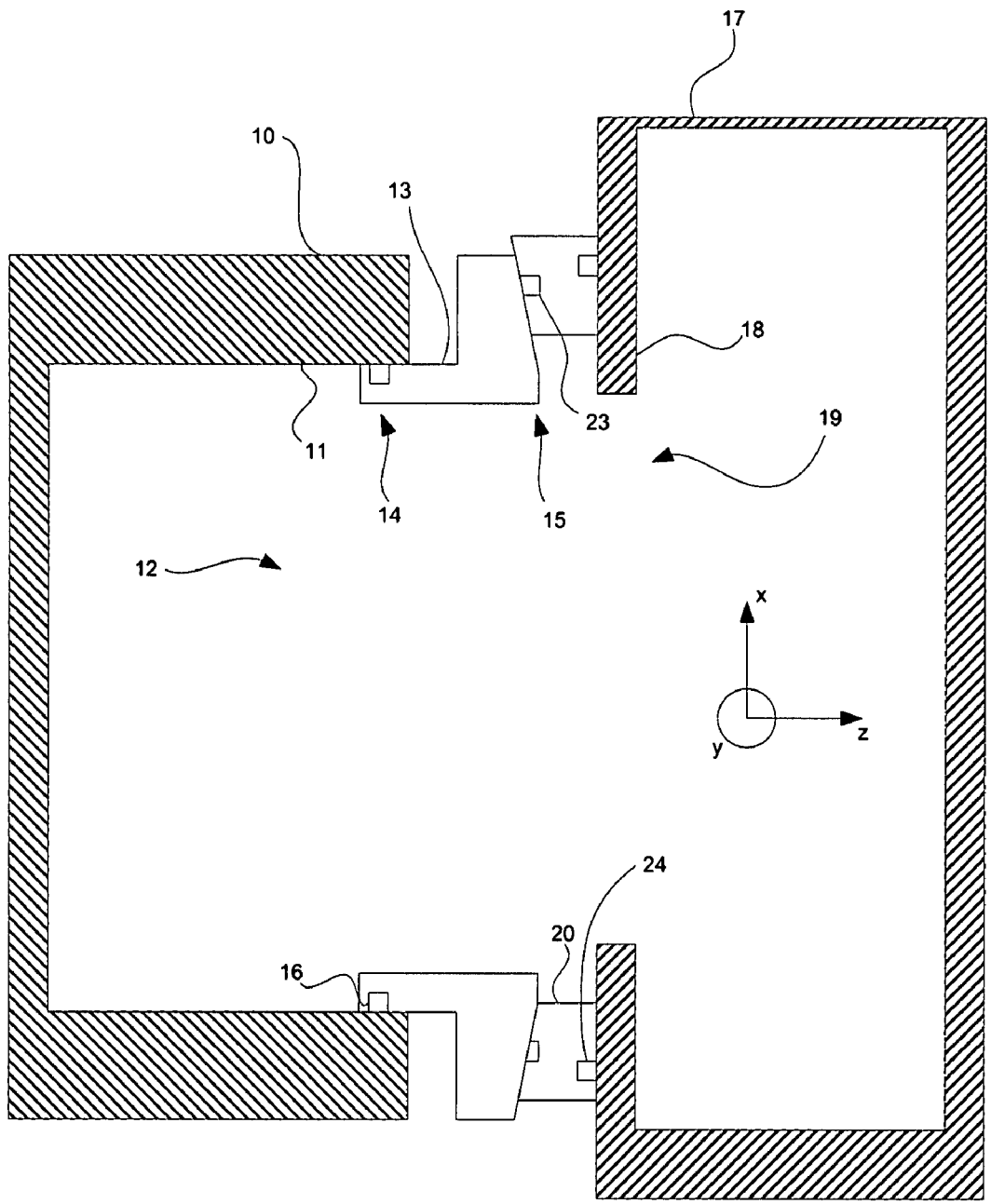
FIG. 4 is another cross-sectional view of an embodiment of an apparatus for sealing between vacuum chambers.

FIG. 4 is another cross-sectional view of an embodiment of an apparatus for sealing between vacuum chambers. Unlike FIG. 3, first sealing unit 13 and second sealing unit 20 do not line up. A vacuum is still formed, however, is between first vacuum chamber 10 and second vacuum chamber 17. Third o-ring 23 still maintains a seal between first sealing unit 13 and second sealing unit 20 even though first sealing unit 13 and second sealing unit 20 do not align perfectly in the x and y direction.

FIG. 5 is a cross-sectional view of an embodiment of a second sealing unit disposed on a second vacuum chamber. Second sealing unit 20 is attached to walls 18 of second vacuum chamber 17. Second sealing unit 20 has at least one aperture 30. Aperture 30 in this embodiment goes through second sealing unit 20 and into second vacuum chamber 17 and is located farther from the center of second sealing unit 20 than second o-ring 24 and third o-ring 23. Aperture 30, however, may be located in other positions relative to second o-ring 24 and third o-ring 23 on second sealing unit 20. In this particular embodiment, part of aperture 30 is substantially larger in diameter than fastener 31. In some embodiments, all or part of aperture 30 may be threaded.

At least one fastener 31 is used to fasten second sealing unit 20 to second vacuum chamber 17. In this embodiment, fasteners 31 are screws. However, fastener 31 may also be, for example, a screw and washer, a set screw used with a nut, a nut that is fastened on studs located on wall 18 of second vacuum chamber 17, or any other apparatus known to those skilled in the art that fastens second sealing unit 20 to second vacuum chamber 17 and allows vacuum to be maintained.

In another embodiment, second sealing unit 20 is permanently disposed on second vacuum chamber 17. In this embodiment, to maintain compliance in the x and y axes illustrated in FIG. 5, the whole of one or more vacuum chambers may need to be translated.

Figure 6:
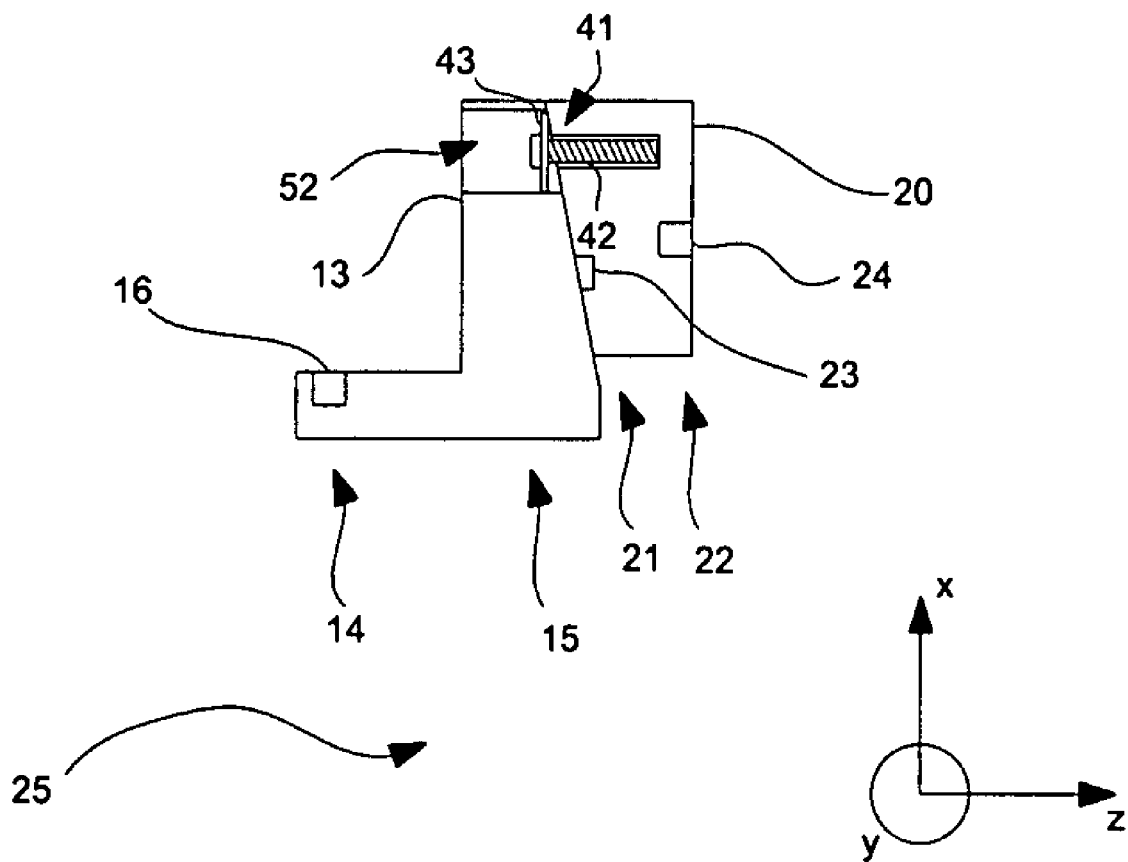
FIG. 6 is a cross-sectional view of an embodiment of a first sealing unit disposed on a second sealing unit.

FIG. 6 is a cross-sectional view of an embodiment of a first sealing unit disposed on a second sealing unit. First sealing unit 13 is fastened to second sealing unit 20. In the embodiment illustrated, this is done using at least one is slot 41. Within slot 41, fastener 42 is inserted with a washer 43. Fastener 42 may be a screw, bolt, or other fastening device known to those skilled in the art that will substantially hold first sealing unit 13 to second sealing unit 20. In this particular embodiment, slot 52 is substantially larger in diameter than fastener 42 and washer 43. In some embodiments, all or part of slot 52 or slot 41 is threaded.

Figure 7:
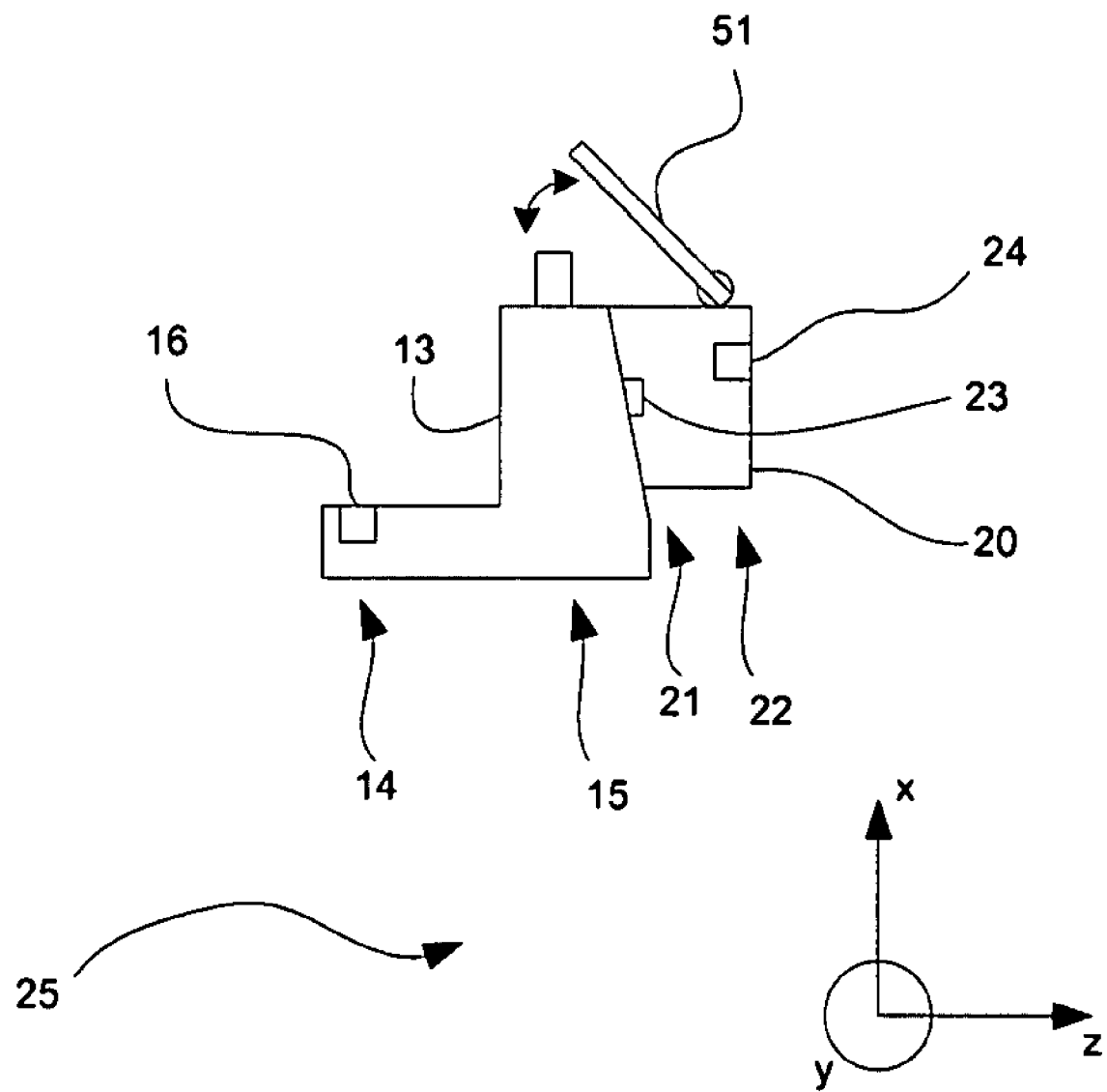
FIG. 7 is a cross-sectional view of an alternate embodiment of a first sealing unit disposed on a second sealing unit.

FIG. 7 is a cross-sectional view of an alternate embodiment of a first sealing unit disposed on a second sealing unit. First sealing unit 13 is fastened to second sealing unit 20. In the embodiment illustrated, this is done using at least one latch 51. Latch 51 of this embodiment has a lever on a hinge that will mate or couple with the opposite portion disposed on the other sealing unit. The hinge portion of latch 51 may be disposed on either first sealing unit 13 or second sealing unit 20. Latch 51 may also allow tightening.

Any other latching device or coupling device known to those skilled in the art may be used to fasten first sealing unit 13 to second sealing unit 20 provided this latching or coupling method allows for a vacuum to be formed. One such example is by using at least one spring-loaded clamp to compress first sealing unit 13 and second sealing unit 20 together.

The terms and expressions which have been employed herein are used as terms of description and not of limitation, and there is no intention in the use of such terms and expressions of excluding any equivalents of the features shown and described (or portions thereof), and it is recognized that various modifications are possible within the scope of the claims. Other modifications, variations, and alternatives are also possible. Accordingly, the foregoing description is by way of example only and is not intended as limiting.

What is claimed is:

1. A sealing system comprising:
a first vacuum chamber having walls defining a first vacuum chamber aperture;
a second vacuum chamber having walls defining a second vacuum chamber aperture;
a first sealing unit having a body defining an opening, said first sealing unit having a proximal end and a distal end, said proximal end of said first sealing unit disposed on said first vacuum chamber;
a first o-ring disposed between said first sealing unit and said first vacuum chamber;
a second sealing unit having a body defining an opening, said second sealing unit having a distal end and a proximal end, said distal end of said second sealing unit disposed on said distal end of said first sealing unit, said proximal end of said second sealing unit disposed on said second vacuum chamber;
a second o-ring disposed between said second sealing unit and said second vacuum chamber; and
a third o-ring disposed between said second sealing unit and said first sealing unit.

2. The sealing system of claim 1, wherein said distal end of said first sealing unit has a substantially convex shape and said distal end of said second sealing unit has a substantially concave shape.

3. The sealing system of claim 1, wherein said distal end of said first sealing unit has a substantially concave shape and said distal end of said second sealing unit has a substantially convex shape.

4. The sealing system of claim 1, wherein said first o-ring is disposed on the outer surface of said first sealing unit.

5. The sealing system of claim 1, wherein said proximal end of said second sealing unit is substantially flat and said second o-ring is disposed around the entire perimeter of said proximal end around said opening.

6. The sealing system of claim 1, wherein said third o-ring is disposed around the entire perimeter of said opening between said second sealing unit and said first sealing unit and is configured to hold a seal.

7. The sealing system of claim 1, wherein said first sealing unit is slidably disposed within said first vacuum chamber aperture of said first vacuum chamber.

8. The sealing system of claim 1, wherein the outer dimensions of said proximal end of said first sealing unit are substantially less than the dimensions of said first vacuum chamber aperture thereby allowing sliding movement.

9. The sealing system of claim 8, wherein the outer dimensions of said distal end of said first sealing unit are substantially larger than the dimensions of said first vacuum chamber aperture thereby halting sliding movement of said first sealing unit.

10. An ion implanter comprising:
an ion generator;
a first vacuum chamber having walls defining a first vacuum chamber aperture;
a second vacuum chamber having walls defining a second vacuum chamber aperture;
a first sealing unit having a body defining an opening, said first sealing unit having a proximal end and a distal end, said proximal end of said first sealing unit disposed on said first vacuum chamber;
a first o-ring disposed between said first sealing unit and said first vacuum chamber;
a second sealing unit having a body defining an opening, said second sealing unit having a distal end and a proximal end, said distal end of said second sealing unit disposed on said distal end of said first sealing unit, said proximal end of said second sealing unit disposed on said second vacuum chamber;

a second o-ring disposed between said second sealing unit and said second vacuum chamber; and a third o-ring disposed between said second sealing unit and said first sealing unit.

11. The ion implanter of claim 10, wherein said distal end of said first sealing unit has a substantially convex shape and said distal end of said second sealing unit has a substantially concave shape.

12. The ion implanter of claim 10, wherein said distal end of said first sealing unit has a substantially concave shape and said distal end of said second sealing unit has a substantially convex shape.

13. The ion implanter of claim 10, wherein said first o-ring is disposed on the outer surface of said first sealing unit.

14. The ion implanter of claim 10, wherein said proximal end of said second sealing unit is substantially flat and said second o-ring is disposed around the entire perimeter of said proximal end around said opening.

15. The ion implanter of claim 10, wherein said third o-ring is disposed around the entire perimeter of said opening between said second sealing unit and said first sealing unit and is configured to hold a seal.

16. The ion implanter of claim 10, wherein said first sealing unit is slidably disposed within said first vacuum chamber aperture of said first vacuum chamber.

17. The ion implanter of claim 10, wherein the outer dimensions of said proximal end of said first sealing unit are substantially less than the dimensions of said first vacuum chamber aperture thereby allowing sliding movement.

18. The ion implanter of claim 17, wherein the outer dimensions of said distal end of said first sealing unit are substantially larger than the dimensions of said first vacuum chamber aperture thereby halting sliding movement of said first sealing unit.

19. The ion implanter of claim 10, wherein said first vacuum chamber comprises an analyzer magnet and said second vacuum chamber comprises a corrector magnet.

20. The ion implanter of claim 10, wherein said first vacuum chamber comprises a corrector magnet and said second vacuum chamber comprises a process chamber.

21. The ion implanter of claim 10, wherein said first vacuum chamber comprises an acceleration column and said second vacuum chamber comprises an analyzer magnet.

22. The ion implanter of claim 10, wherein said first vacuum chamber comprises a source chamber and said second vacuum chamber comprises an analyzer magnet.

* * * * *